(12) United States Patent
Lin et al.

(10) Patent No.: US 12,401,005 B2
(45) Date of Patent: Aug. 26, 2025

(54) OPTOELECTRONIC PACKAGE STRUCTURE AND PHOTO-INTERRUPTING DEVICE

(71) Applicant: LITE-ON TECHNOLOGY CORPORATION, Taipei (TW)

(72) Inventors: Chen-Hsiu Lin, New Taipei (TW); Shirley Sia, New Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 592 days.

(21) Appl. No.: 17/686,472

(22) Filed: Mar. 4, 2022

(65) Prior Publication Data

US 2022/0320058 A1 Oct. 6, 2022

Related U.S. Application Data

(60) Provisional application No. 63/168,266, filed on Mar. 31, 2021.

(30) Foreign Application Priority Data

Nov. 25, 2021 (CN) .......................... 202122920399.3

(51) Int. Cl.
*H01L 25/16* (2023.01)
*H10F 77/00* (2025.01)
(Continued)

(52) U.S. Cl.
CPC .......... *H01L 25/167* (2013.01); *H01L 25/165* (2013.01); *H10F 77/407* (2025.01);
(Continued)

(58) Field of Classification Search
CPC ... H01L 33/483; H01L 33/486; H01L 25/165; H10H 20/8506
See application file for complete search history.

(56) References Cited

U.S. PATENT DOCUMENTS

2012/0112337 A1* 5/2012 Groetsch ............... H01L 33/641
 438/122
2012/0153327 A1* 6/2012 Kim ....................... H01L 33/60
 438/27
(Continued)

*Primary Examiner* — Matthew L Reames
(74) *Attorney, Agent, or Firm* — Li & Cai Intellectual Property (USA) Office

(57) ABSTRACT

An optoelectronic package structure and a photo-interrupting device are provided. The photo-interrupting device includes a casing and two optoelectronic package structures oppositely arranged. The optoelectronic package structure includes a housing, a first lead frame, a second lead frame, an optoelectronic element, and a sealing element. The optoelectronic element is disposed on the first lead frame and is electrically connected to the second lead frame through a conducting wire. The housing encapsulates one part of each of the first lead frame and the second lead frame. Another part of each of the first lead frame and the second lead frame correspondingly protrudes from one end of the housing having an opening arranged on a first surface, and the optoelectronic element is exposed through the opening. The sealing element covers the optoelectronic element, and a surface of the sealing element is not higher than the first surface of the housing.

19 Claims, 11 Drawing Sheets

(51) Int. Cl.
*H10F 77/40* (2025.01)
*H10F 77/50* (2025.01)
*H10H 20/85* (2025.01)
*H10H 20/856* (2025.01)
*H10H 20/857* (2025.01)

(52) U.S. Cl.
CPC ............ *H10F 77/50* (2025.01); *H10F 77/933* (2025.01); *H10H 20/8506* (2025.01); *H10H 20/856* (2025.01); *H10H 20/857* (2025.01)

(56) References Cited

U.S. PATENT DOCUMENTS

2012/0305976 A1* 12/2012 Bak .................. H01L 33/486
　　　　　　　　　　　　　　　　　　　　　257/E33.066
2014/0252574 A1* 9/2014 Nakabayashi .... H01L 23/49562
　　　　　　　　　　　　　　　　　　　　　174/255

\* cited by examiner

OPTOELECTRONIC PACKAGE STRUCTURE AND PHOTO-INTERRUPTING DEVICE

CROSS-REFERENCE TO RELATED PATENT APPLICATION

This application claims priorities to the U.S. Provisional Patent Application Ser. No. 63/168,266 filed on Mar. 31, 2021 and to China Patent Application No. 202122920399.3, filed on Nov. 25, 2021 in People's Republic of China, which applications are incorporated herein by reference in their entireties.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a photo-interrupting device, and more particularly to an optoelectronic package structure and a photo-interrupting device that can shorten an optical path.

BACKGROUND OF THE DISCLOSURE

Currently, transmission type photo sensors (also known as photointerrupters) are widely used in electronic products, such as mice. In the related art, a light-emitting element and a light-receiving element are oppositely disposed in a casing of the photointerrupter. When an object to be detected is located between the light-emitting element and the light-receiving element, light emitted by the light-emitting element is blocked, which results in a current change in the light-receiving element such that the presence of the object is detected. Each of the light-emitting element and the light-receiving element of the photointerrupter may have a protruded lens so that an overall size and a required optical path of the photointerrupter are usually larger. In addition, the protruded lens protruding on each of the light-emitting element and the light-receiving element is prone to dust and dirt, which results in a mistouch.

For the gaming mouse, a small and slim appearance is required, and a shorter optical path can enhance speed and accuracy of a user's response. Therefore, the gaming mouse can provide a quick and real-time feedback when the user clicks on it. However, meeting such demands is difficult for conventional photo interrupters.

Therefore, how to improve a structural design, so as to reduce a size of the conventional photointerrupter and thus reduce an overall size of a mouse, as well as shorten the optical path between the light-emitting element and the light-receiving element to increase a speed of the feedback, has become one of the important issues to be addressed in the related art.

SUMMARY OF THE DISCLOSURE

In response to the above-referenced technical inadequacies, the present disclosure provides an optoelectronic package structure and a photo-interrupting device.

In one aspect, the present disclosure provides an optoelectronic package structure, which includes a first lead frame, a second lead frame, an optoelectronic element, a housing, and a sealing element. The second lead frame is spaced apart from the first lead frame. The optoelectronic element is disposed on the first lead frame, and is electrically connected to the second lead frame through a conducting wire. The housing encapsulates one part of the first lead frame and one part of the second lead frame. Another part of the first lead frame and another part of the second lead frame correspondingly protrude from one end of the housing, the housing has an opening arranged on a first surface, and the optoelectronic element is exposed through the opening. The sealing element covers the optoelectronic element and seals the opening, and a surface of the sealing element is not higher than the first surface of the housing.

In certain embodiments, the housing has a first end, a second end, a first surface, and a second surface, the first end and the second end are arranged opposite to each other, the first surface is connected between the first end and the second end, the second surface is opposite to the first surface, the first surface is recessed in a direction toward the second surface to form a cavity, the cavity is spatially communicated with the opening, and the optoelectronic element is arranged in the cavity.

In certain embodiments, the housing is made of a light-reflective material so that a reflector cup is formed in the cavity, the optoelectronic element, a portion of the first lead frame, and a portion of the second lead frame are exposed from the reflector cup, and a projection of the reflector cup on the first surface is in a rectangular shape.

In certain embodiments, the surface of the sealing element is lower than or flush with the first surface.

In certain embodiments, the one part of the first lead frame arranged in the housing has a first extension portion, a first bending portion, and a mounting portion, the mounting portion is arranged adjacent to the first end, the first bending portion is connected between the first extension portion and the mounting portion, and the optoelectronic element is disposed on the mounting portion.

In certain embodiments, the mounting portion has a plurality of flanges, and the plurality of flanges are evenly arranged at a periphery of the mounting portion.

In certain embodiments, the second lead frame has multiple bending structures and extends toward the second end, the one part of the second lead frame arranged in the housing has a second extension portion, a second bending portion, and a third bending portion, the second bending portion is connected between the second extension portion and the third bending portion, and the optoelectronic element is electrically connected to the second bending portion through the conducting wire.

In certain embodiments, the second bending portion and the third bending portion as well as the mounting portion, the first bending portion, and the first extension portion are spaced apart from each other in a predetermined distance and are conformally arranged.

In certain embodiments, each of the first extension portion and the second extension portion is adjacent to the second end, and a rough structure is formed on each of a surface of the first extension portion and a surface of the second extension portion.

In certain embodiments, a length of distribution of the rough structure on the surface of the first extension portion is about 1.5 to 2.5 times of a width of the first lead frame, and a length of distribution of the rough structure on the surface of the second extension portion is about 1.5 to 2.5 times of a width of the second lead frame.

In certain embodiments, an arrangement of the rough structure on each of the first extension portion and the second extension portion is between two boundary lines, and a distance between one of the two boundary lines that is near the second end and the second end is between 0.1 mm and 0.45 mm.

In certain embodiments, the one part of the first lead frame and the one part of the second lead frame that are arranged in the housing each have at least one stepped structure, and two protruding parts are symmetrically formed on two side surfaces of each of the first lead frame and the second lead frame by the stepped structure.

In certain embodiments, the second end has a concave part formed in a center thereof, the housing has a bump formed on the first surface, and the bump is adjacent to the concave part of the second end.

In certain embodiments, a step structure is formed at an edge of the opening of the cavity, the step structure has a third surface, the third surface is parallel to the first surface, the third surface and the first surface have a predetermined height therebetween, and the predetermined height is between 0.05 mm and 2 mm.

In certain embodiments, the first end of the housing has a slot.

In certain embodiments, the housing at least partially fills a gap between the first lead frame and the second lead frame, and correspondingly extends to a part of an upper surface of the first lead frame and a part of an upper surface of the second lead frame.

In certain embodiments, the optoelectronic package structure is a light-emitting element or a light-receiving element.

In another aspect, the present disclosure provides a photo-interrupting device, which includes a casing and two optoelectronic package structures as described above. The two optoelectronic package structures are disposed in the casing and opposite to each other, and the two optoelectronic package structures have an optical path with a predetermined distance. The optoelectronic element in one of the two optoelectronic package structures is configured to emit light at a specific wavelength, and the optoelectronic element in another one of the two optoelectronic package structures is configured to receive the light at the specific wavelength.

In certain embodiments, the photo-interrupting device further includes an object to be detected which has a light-transmitting region and a masking region. The casing has two accommodating compartments arranged therein. The two optoelectronic package structures are respectively arranged in the two accommodating compartments. The object to be detected is configured to move reciprocally between the two optoelectronic package structures, so that the light-transmitting region or the masking region can be located in the optical path accordingly to change an amount of light received by one of the two optoelectronic package structures.

Therefore, one of the beneficial effects of present disclosure is that, in the optoelectronic package structure and the photo-interrupting device provided by the present disclosure, by virtue of "the optoelectronic element disposed on the first lead frame, and the optoelectronic element being electrically connected to the second lead frame through the conducting wire" and "the sealing element covering the optoelectronic element and sealing the opening, and the surface of the sealing element being not higher than the first surface of the housing," the size of the optoelectronic package structure can be reduced and a length of the optical path in the photo-interrupting device can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
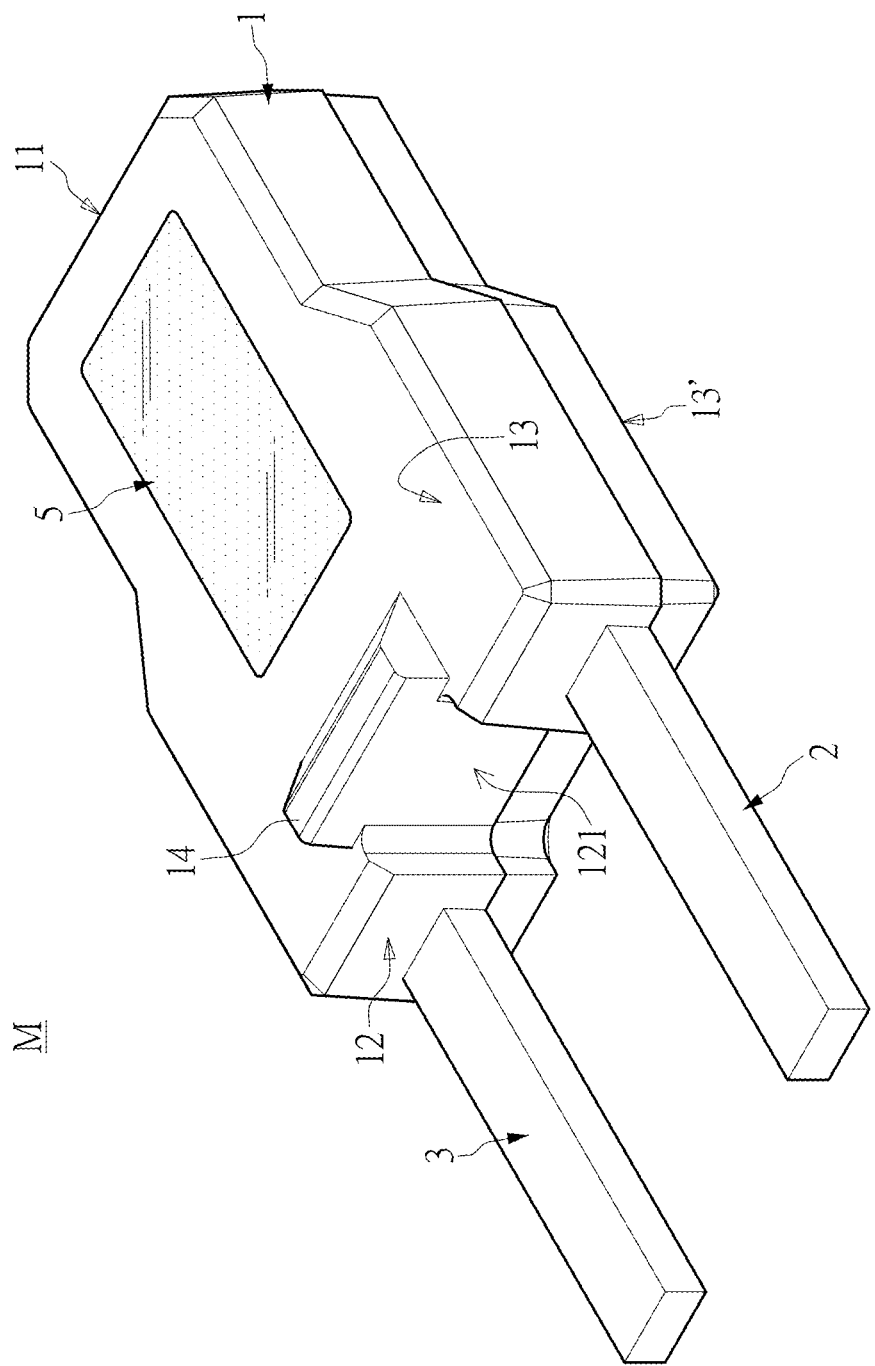
FIG. 1 is a schematic perspective view of an optoelectronic package structure according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

EMBODIMENTS

Figure 2:
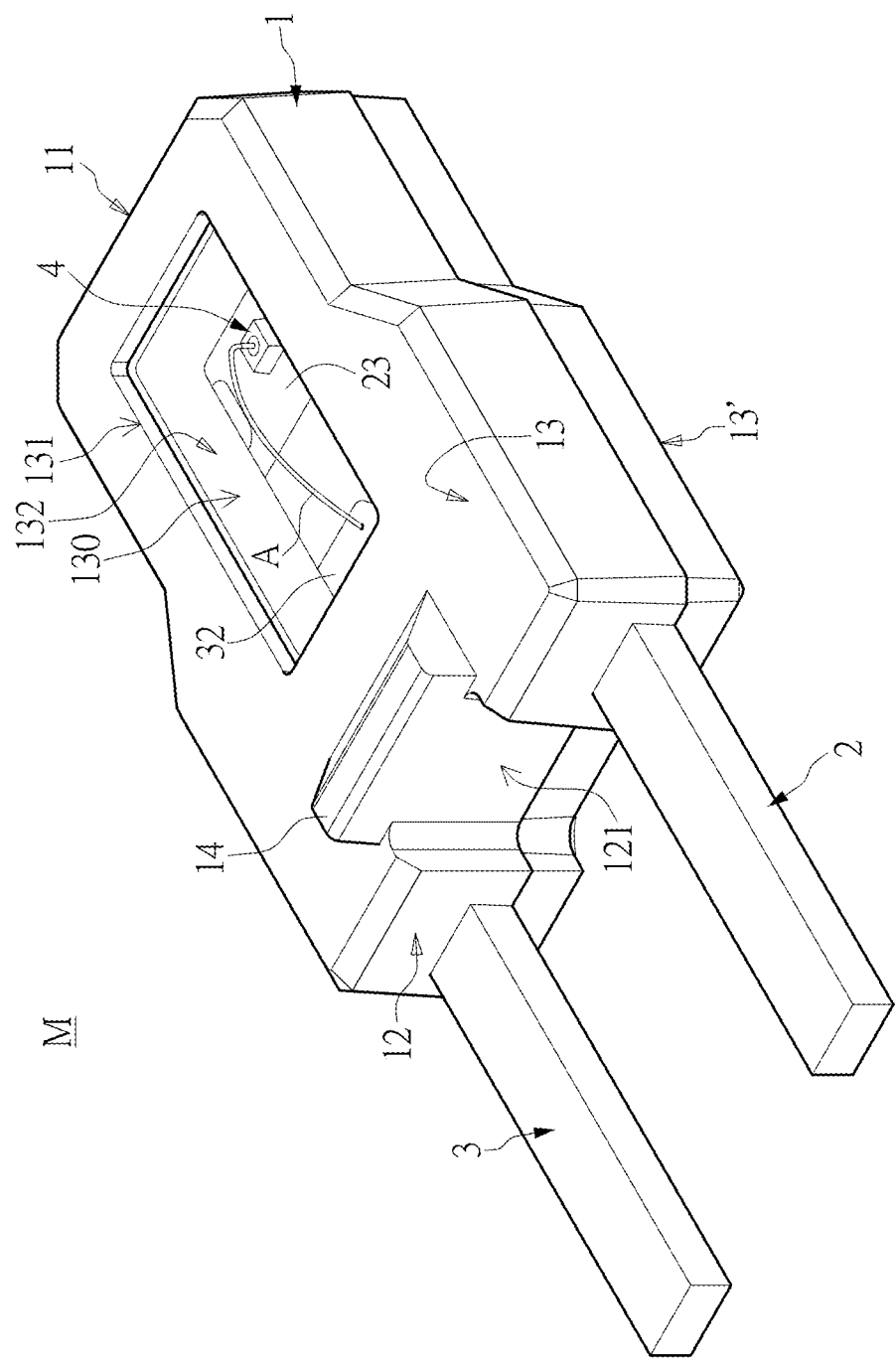
FIG. 2 is a schematic perspective view of the optoelectronic package structure without a sealing element according to the present disclosure.

Referring to FIG. 1 and FIG. 2, FIG. 1 is a schematic perspective view of an optoelectronic package structure of the present disclosure, and FIG. 2 is a schematic perspective view of the optoelectronic package structure without a sealing element of the present disclosure. The present disclosure provides an optoelectronic package structure M. Specifically, the optoelectronic package structure M is a package structure with a plastic leaded chip carrier (PLCC), which includes a housing 1, a first lead frame 2, a second lead frame 3, an optoelectronic element 4, and a sealing element 5. The housing 1 has a first end 11 and a second end 12, a first surface 13, and a second surface 13'. The first end 11 and the second end 12 are arranged opposite to each other, the first surface 13 is connected between the first end 11 and the second end 12, and the second surface 13' is opposite to the first surface 13. As shown in FIG. 2, the housing 1 encapsulates one part of the first lead frame 2 and one part of the second lead frame 3, and another part of the first lead frame 2 and another part of the second lead frame 3 correspondingly protrude from one end (e.g., the second end 12) of the housing 1 and are arranged in parallel to each other. The housing 1 has an opening 131 on the first surface 13, the housing 1 has a cavity 130 recessed inward from the first surface 13, and the cavity 130 is surrounded by an inner wall 132 integrally formed with the housing 1. The optoelectronic element 4 is disposed on the first lead frame 2 and is arranged in the cavity 130. In addition, the optoelectronic element 4 is electrically connected to the second lead frame 3 through a conducting wire A. The optoelectronic element 4, a portion of the first lead frame 2 (i.e., a part of a mounting portion 23, and the detailed structure of the first lead frame 2 is referred to in the following descriptions), and a portion of the second lead frame 3 (i.e. a portion of a second bending portion 32, and the detailed structure of the second lead frame 3 is referred to in the following descriptions) are exposed through the opening 131. The sealing element 5 is arranged in the cavity 130, covers the optoelectronic element 4, and seals the opening 131. In this embodiment, the optoelectronic element 4 mounted on the planar surface of the first lead frame 2 within the cavity 130 is encapsulated by the sealing element 5, as illustrated in FIG. 1. The sealing element 5 is made of an optically transparent substance so that light from the optoelectronic element 4 can travel through the sealing element 5. As an example, the sealing element 5 can be made of polymer (formed from liquid or semisolid precursor material such as monomer), epoxy (e.g., clear resin or tinted resin), silicone, glass or a hybrid of silicone and epoxy, but the present disclosure is not limited thereto. In certain embodiments, the optically transparent substance can have a pigment or other properties that filter out light at unwanted wavelengths while allowing light at desired wavelengths to pass through, but the present disclosure is not limited thereto.

For example, the housing 1 is formed by injection molding of plastic. The housing 1 can be made of a light-reflective molding plastic, such as light-reflective epoxy resin (e.g., white, silver, or other colored epoxy resin) or other light-reflective resin or polymers, such that the cavity 130 and the inner wall 132 surrounding the cavity 130 collectively form a reflector cup. In the present embodiment, a projection of the reflector cup on the first surface 13 is approximately in a rectangular shape, but is not limited thereto. In another application, the housing 1 can also be an opaque dark housing, such as a black housing. More specifically, a reflective coating layer can be formed on the inner surface of the cavity 130 according to design requirements.

In addition, the optoelectronic element 4 can be a light-emitting element or a light-receiving element. The optoelectronic element 4 can be a visible light-emitting diode, an infrared light-emitting diode (IR LED), a phototransistor (PTR), a photo diode, or a photo integrated circuit (IC). When the optoelectronic element 4 is the IR LED, the optoelectronic package structure M can be used as a transmitter, i.e., a light-emitting element. When the optoelectronic element 4 is the PTR, the photo diode, or the photo IC, the optoelectronic package structure M can be used as a receiver, i.e., a light-receiving element. Further, when the optoelectronic element 4 is the IR LED, a light emitting angle and light extraction efficiency of infrared light emitted by the IR LED can be increased by reflecting through the reflector cup (i.e., the cavity 130).

Figure 5:
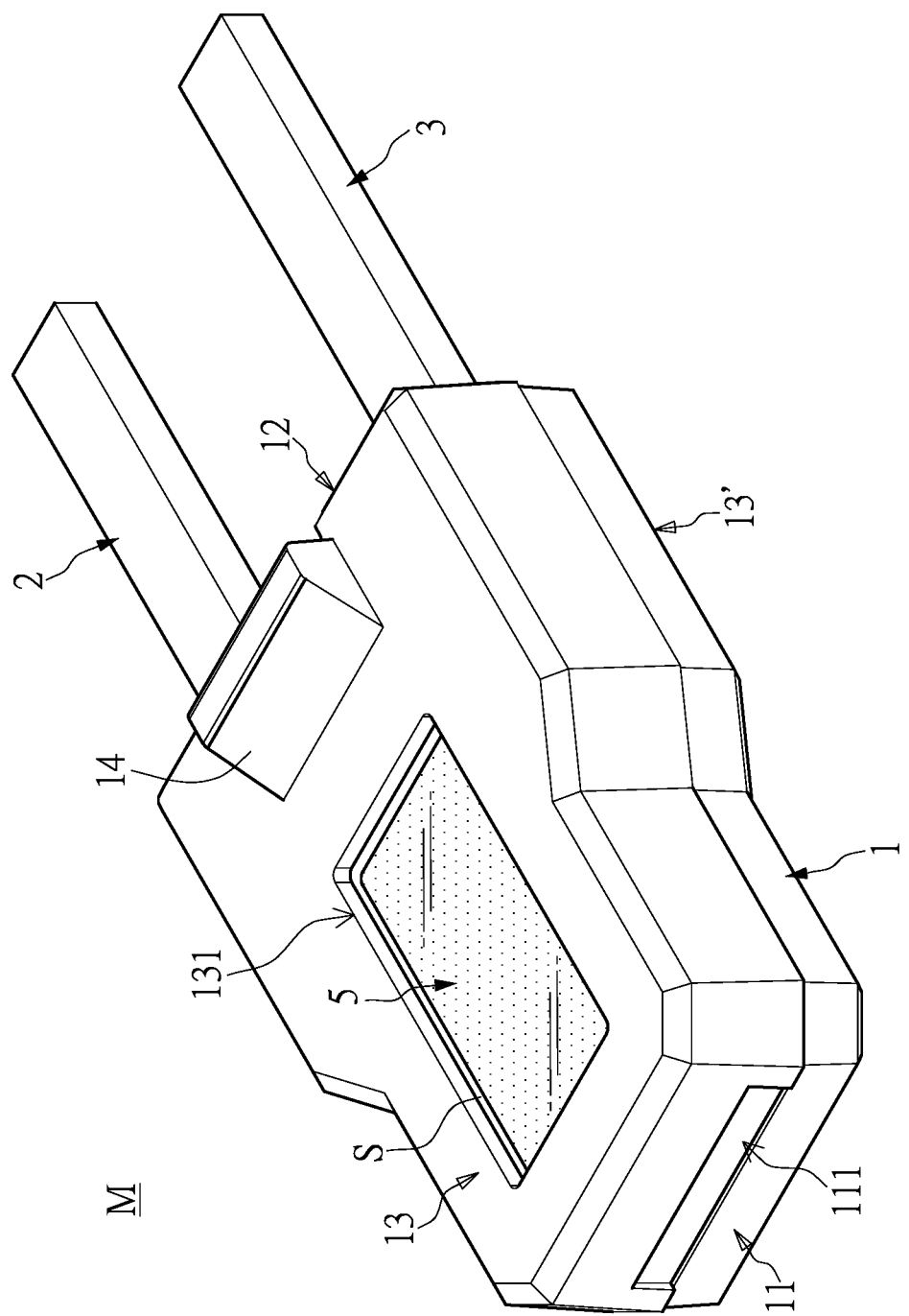
FIG. 5 is a schematic perspective view of an optoelectronic package structure according to another embodiment of the present disclosure.

In addition, referring to FIG. 5, FIG. 5 is a schematic perspective view of the optoelectronic package structure according to another embodiment of the present disclosure. The first end 11 of the housing 1 has a slot 111. In a process of molding the housing 1, a process of injection molding is performed on a metal sheet (not shown in the figures) having the first lead frame 2 and the second lead frame 3, so that the housing 1 is directly molded on the first lead frame 2 and the second lead frame 3. Notably, in the process of injection molding, since each of one end of the first lead frame 2 and one end of the second lead frame 3 is connected to an elongated cantilever material of the metal sheet (i.e., each of another end of the first lead frame 2 and another end of the second lead frame 3 is a free end), a part of the metal sheet can be extended and inserted into the slot 111 formed in the first end 11 of the housing 1 so as to support the housing 1. Therefore, materials can be prevented from falling out when a process of cutting/singulation is performed on the molded housing 1 (i.e., removing the first lead frame 2 and the second lead frame 3 from the metal sheet).

Figure 3:
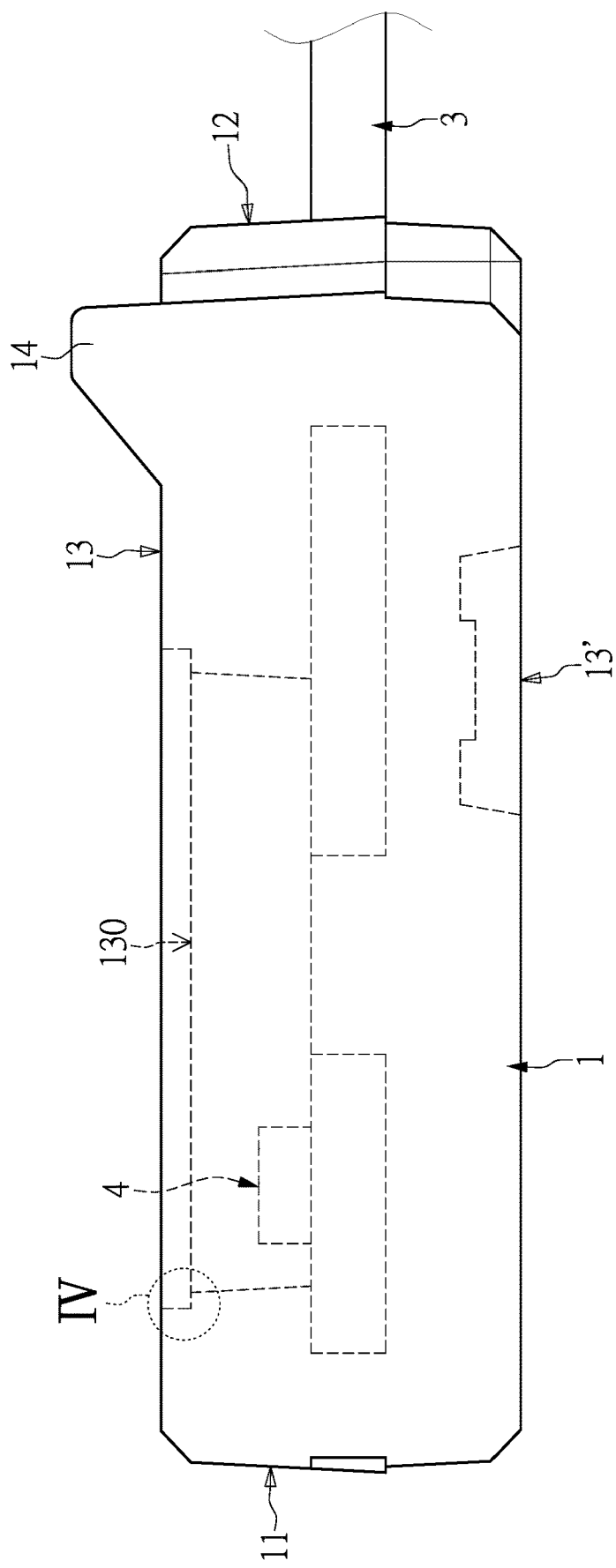
FIG. 3 is a side view of FIG. 1.
Figure 4:
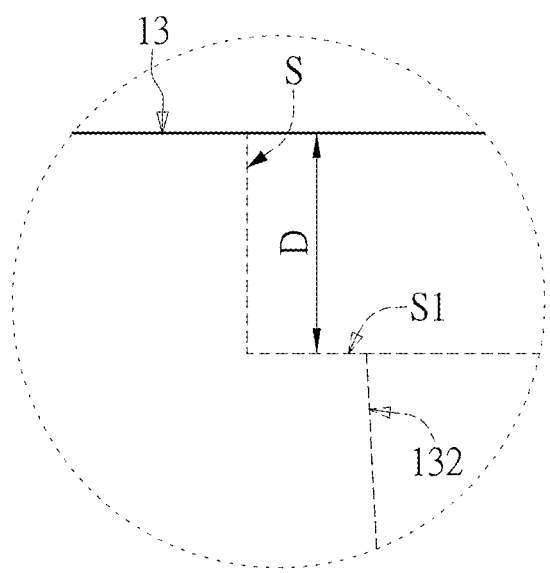
FIG. 4 is an enlarged view of part IV of FIG. 3.

Referring to FIG. 1, FIG. 3, and FIG. 4, FIG. 3 is a side view of FIG. 1, and FIG. 4 is an enlarged view of part IV of FIG. 3. As shown in FIG. 3 and FIG. 4, a step structure S is formed at a boundary between the inner wall and the first surface of the housing, the step structure S has a third surface S1, the third surface S1 is parallel to the first surface 13, and the third surface S1 and the first surface 13 have a predetermined height D therebetween. For example, the predetermined height D is between 0.05 mm and 2 mm. In the present disclosure, through a design of the step structure S, an amount of the sealing element 5 (i.e., the amount of the optically transparent substance filled into the cavity 130) can be effectively controlled, so that a surface of the sealing element 5 in the cavity 130 is not higher than the first surface 13 of the housing 1. In this way, the optically transparent substance can be prevented from overflowing over the opening of the cavity 130 to interfere a process of assembly, and a demand of small and slim appearance can be met. In addition, an area of the optically transparent substance on a light-emitting surface of the light-emitting element or on a light-receiving surface of the light-receiving element (i.e., the surface of the sealing element 5) can be effectively reduced, so that a conventional problem of mistouch due to dirty lens caused by the dust (i.e., too much dust may block the light emitted by the light-emitting element, so that the light-receiving element send a wrong signal due to not receiving the light signal) can be reduced, thereby improving product yields. Therefore, referring to FIG. 1 and FIG. 5, in the present disclosure, the surface of the sealing element 5 in the cavity 130 is not higher than the first surface 13 of the housing 1. For example, the surface of the sealing element 5 as shown in FIG. 1 can be substantially flush with the first surface 13 of the housing 1, while the surface of the sealing element 5 as shown in FIG. 5 can be lower than the first surface 13 of the housing 1, but the present disclosure is not limited thereto.

Figure 6:
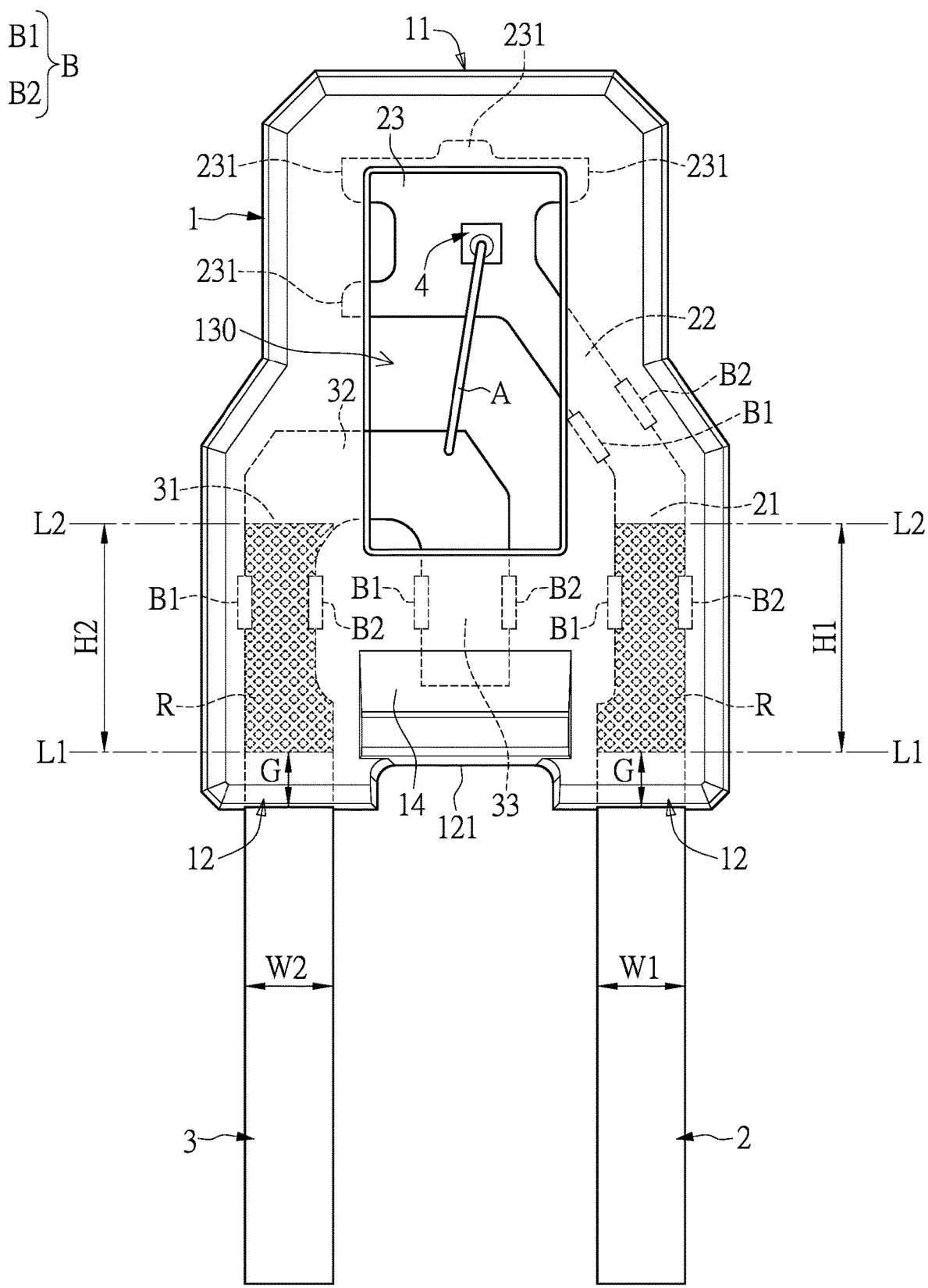
FIG. 6 is a schematic view of an internal structure of the optoelectronic package structure according to the present disclosure.

Referring to FIG. 6, FIG. 6 is a schematic view of an internal structure of the optoelectronic package structure according to the present disclosure. The first lead frame 2 and the second lead frame 3 are arranged opposite to each other and spaced apart. A part of the first lead frame 2 is embedded in the housing 1, and the part of the first lead frame 2 has a first extension portion 21, a first bending portion 22 and a mounting portion 23. The mounting portion 23 is arranged adjacent to the first end 11, the first bending portion 22 is connected between the first extension portion 21 and the mounting portion 23, and the first bending portion 22 is bent inward at an angle with respect to the first extension portion 21. A part of the second lead frame 3 is embedded in the housing 1 and has multiple bending structures (e.g., one end of the part of the second lead frame 3 is bent in a direction toward the second end 12 so as to form an inverted U shape), and the part of the second lead frame 3 has a second extension portion 31, the second bending portion 32, and a third bending portion 33. The second bending portion 32 is connected between the second extension portion 31 and the third bending portion 33. The second bending portion 32 is bent relative to the second extension portion 31, and the third bending portion 33 is bent relative to the second bending portion 32. Preferably, the second bending portion 32 and the third bending portion 33 as well as the carrier 23, the first bending portion 22, and the first extension portion 21 are spaced apart from each other in a predetermined distance and are conformally arranged. Therefore, such a structural design can overcome a problem that too long lead of the second lead frame 3 are easily uneven, which results in an uneven surface of the housing 1 during injection molding and a failure of wire bonding. Accordingly, a wire bonding yield can be effectively increased. The first lead frame 2 and the second lead frame 3 are configured to have different polarities (i.e., cathode and anode). The optoelectronic element 4 is fixedly disposed on the mounting portion 23 of the first lead frame 2 through a chip bonding adhesive (not shown in the figures), i.e., the mounting portion 23 is used as a chip bonding area, and the optoelectronic element 4 is electrically connected to the second bending portion 32 through the conducting wire A. In the present embodiment, the optoelectronic element 4 can be, for example, a vertical type light-emitting diode, that is, two electrodes of the optoelectronic element 4 (not shown in the figures) are respectively arranged on an upper surface and a lower surface of the optoelectronic element 4. One end of the conducting wire A is electrically connected to one of the two electrodes that is arranged on the upper surface of the optoelectronic element 4, another end of the conducting wire A is electrically connected to the second bending portion 32, and another one of the two electrodes that is arranged on the lower surface of the optoelectronic element 4 is directly coupled to the mounting portion 23, but the present disclosure is not limited thereto.

Referring to FIG. 6, a plurality of flanges 231 are formed at a periphery of the mounting portion 23. In the present embodiment, the mounting portion 23 has at least three flanges 231, and the at least three flanges 231 are evenly arranged on sides of the mounting portion 23. In the present disclosure, a bonding strength between the first lead frame 2 and the housing 1 can be increased through a design of the plurality of flanges 231. Further, in a process of manufacturing the optoelectronic package structure M, the at least three flanges 231 of the mounting portion 23 can be used for effectively engaging to the plastic (housing 1) that is configured to form the housing 1 before the first lead frame 2 and the second lead frame 3 are removed from the metal sheet. Four flanges 231 are exemplarily shown in FIG. 6, and the four flanges 231 can be respectively used as four joints for engaging to the housing 1. The four joints are arranged in a plane so as to maintain flatness of the metal sheet. In addition, in the process of molding the housing 1, overflow of molding material can be avoided and stability during injection can be maintained when an injection mold core (not shown in the figures) is pressed against the metal sheet.

Figure 7:
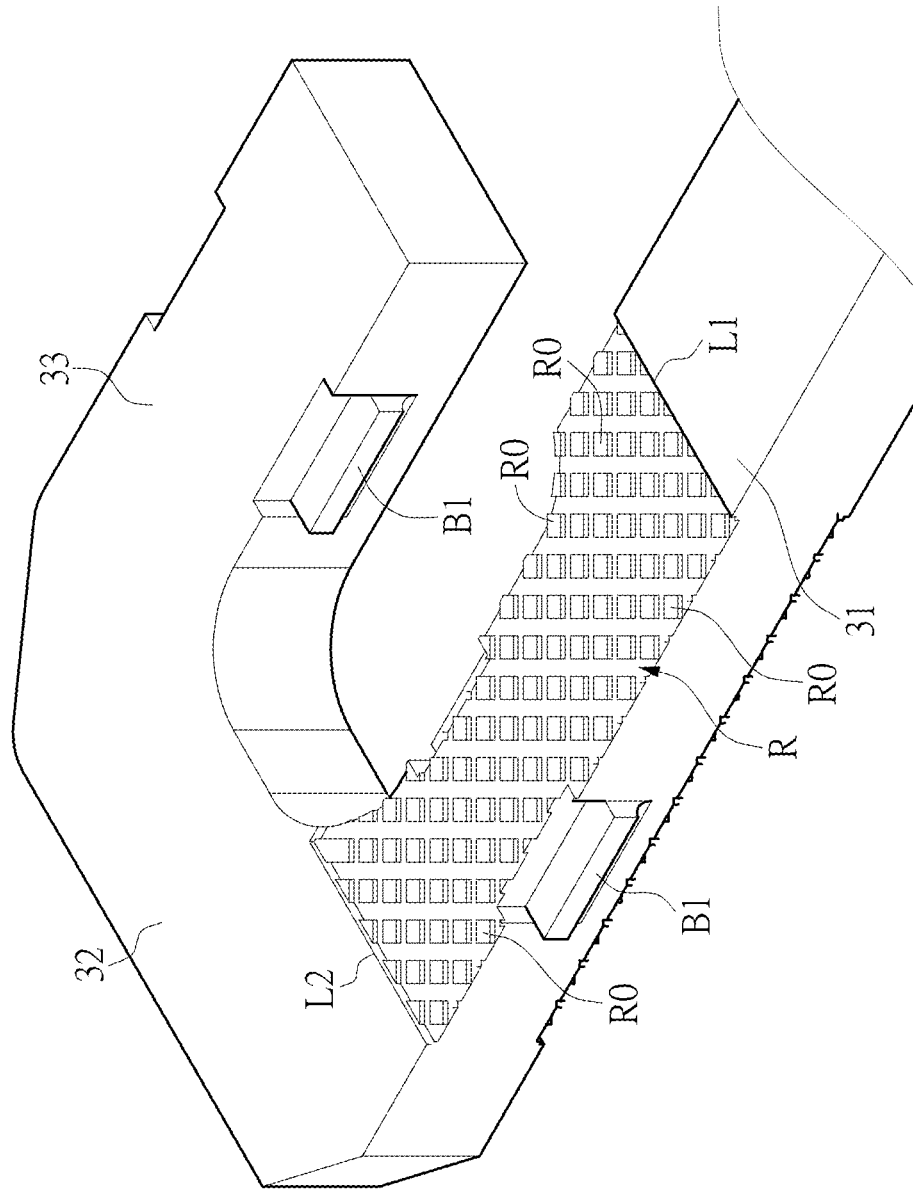
FIG. 7 is a schematic view of a second lead frame of the optoelectronic package structure according to the present disclosure.
Figure 8:
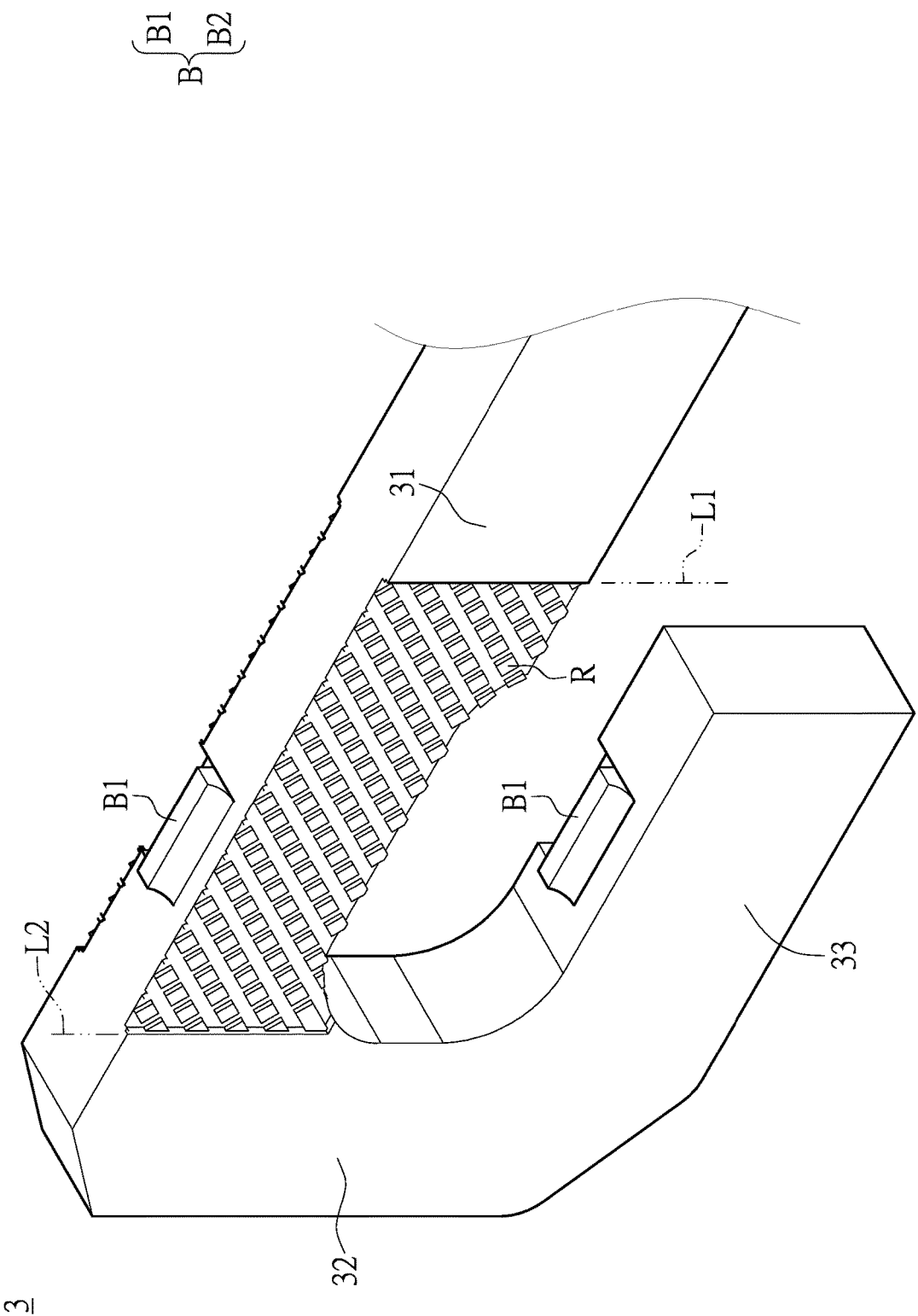
FIG. 8 is a schematic view of another view of the second lead frame of the optoelectronic package structure according to the present disclosure.

Referring to FIG. 6 to FIG. 8, FIG. 7 is a schematic view of the second lead frame of the optoelectronic package structure according to the present disclosure, and FIG. 8 is a schematic view of another view of a second lead frame of the optoelectronic package structure according to the present disclosure. As shown in FIG. 6, each of the first extension portion 21 and the second extension portion 31 is adjacent to the second end 12, and a textured area R including a plurality of substantially square protrusions R0 is formed on each of a surface of the first extension portion 21 and a surface of the second extension portion 31. For example, as shown in FIG. 7 and FIG. 8, the textured area R is a granular structure (also known as an embossed structure) formed on the surface of each of the first extension portion 21 and the second extension portion 31, but the present disclosure is not limited to a type of the textured area R. In the present embodiment, referring to FIG. 7 and FIG. 8 in which the second lead frame 3 is exemplarily shown, the textured area R is formed correspondingly on an upper surface or/and a lower surface of the first extension portion 21 of the first lead frame 2 and on an upper surface or/and a lower surface of the second extension portion 31 of the second lead frame 3. Further, a length of distribution H1 of the textured area R on the surfaces (e.g., the upper surface) of the first extension portion 21 is about 1.5 to 2.5 times of a width W1 of the first lead frame 2, and a length of distribution H2 of the textured area R on the surfaces (e.g., the upper surface) of the second extension portion 31 is about 1.5 to 2.5 times of a width W2 of the second lead frame 3. An arrangement of the textured area R on each of the first extension portion 21 and the second extension portion 31 is between two boundary lines L1, L2, and a distance G between the boundary line L1 that is near the second end 12 and the second end 12 is between 0.1 mm and 0.45 mm. For the optoelectronic package structure M, if adhesion strength between the housing 1 and the lead frames is insufficient, water vapor from an outside can easily enter an inside of the optoelectronic package structure M through an engagement surface between the housing 1 and the lead frames (i.e., the engagement surface between the second end 12 of the housing 1, and each of the first lead frame 2 and the second lead frame 3). Therefore, in the present disclosure, the textured area R is formed in an area of each of the first lead frame 2 and the second lead frame 3 that is adjacent to the second end 12 (i.e., the first extension portion 21 and the second extension portion 31) so as to increase a bonding strength between the housing 1 and the lead frames 2, 3 and to effectively prevent the water vapor from entering the optoelectronic package structure M.

Referring to FIG. 7 and FIG. 8, the one part of the first lead frame 2 and the one part of the second lead frame 3 that are arranged in the housing 1 each have at least one stepped structure B, and two protruding parts B1, B2 are symmetrically formed on two side surfaces of each of the first lead frame 2 and the second lead frame 3 by the stepped structure B. In the present disclosure, through a design of the symmetrical protruding parts B1, B2, a problem that the first lead frame 2 and the second lead frame 3 are prone to warp due to excess length thereof can be improved, thereby maintaining the stability during injection and effectively increasing the yield of wire bonding. More specifically, the at least one stepped structure B not only increases a coupling area between the plastic (housing 1) and the first lead frame 2/the second lead frame 3 by extending horizontally, but also increases the coupling force between the plastic (housing 1) and the first lead frame 2/the second lead frame 3 by having a stepped section in a vertical direction, thereby increasing the stability during plastic injection to enhance the flatness of the first lead frame 2/the second lead frame 3, and improving the yield of wire bonding. In addition, it should be noted that, the stepped structure B shown in FIG. 6 to FIG. 8 is for illustrative purposes only, and the present disclosure is not limited to a shape, a number, and a position of the stepped structure B.

Figure 9:
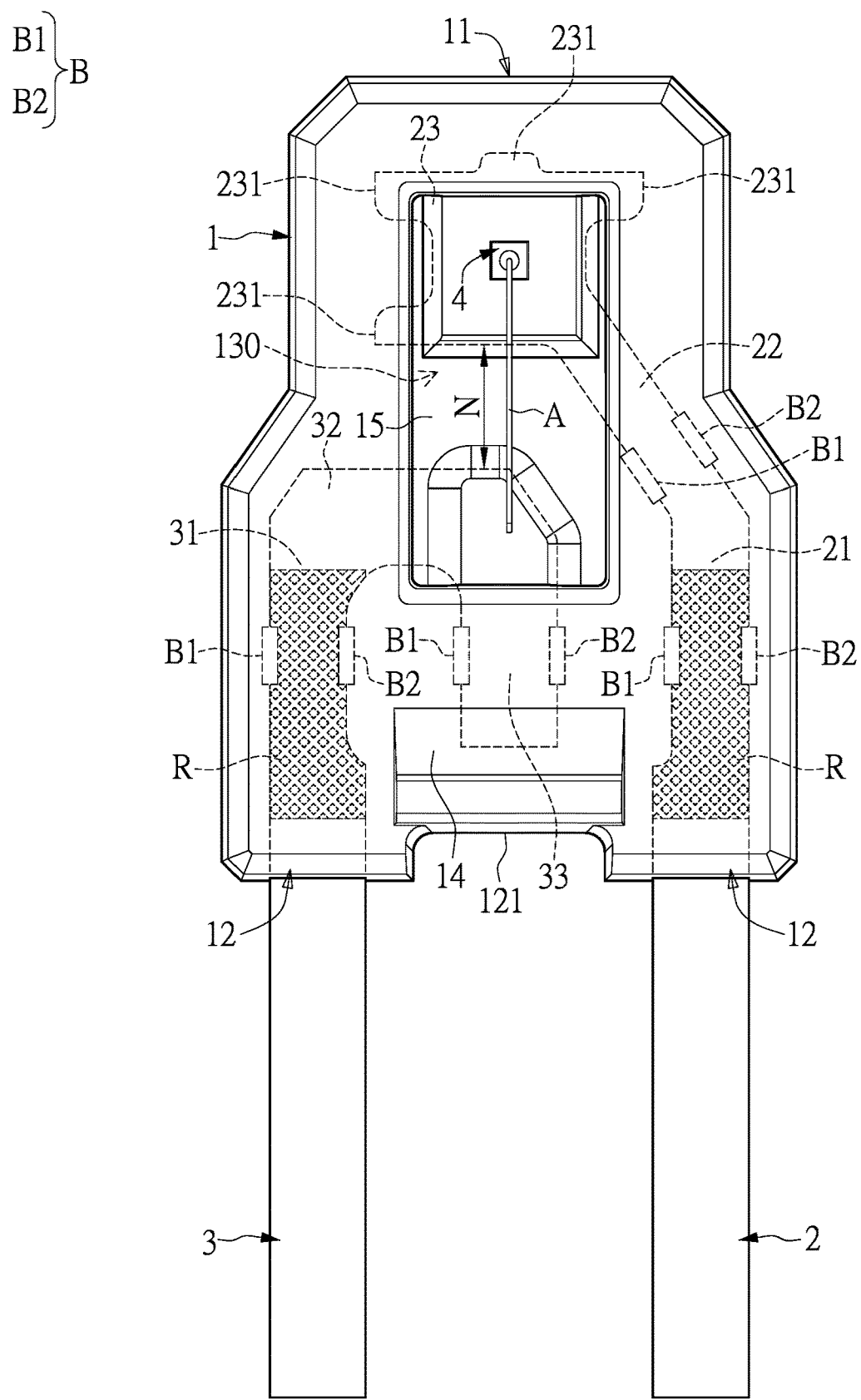
FIG. 9 is a schematic perspective view of the optoelectronic package structure without a sealing element according to another embodiment of the present disclosure.
Figure 10:
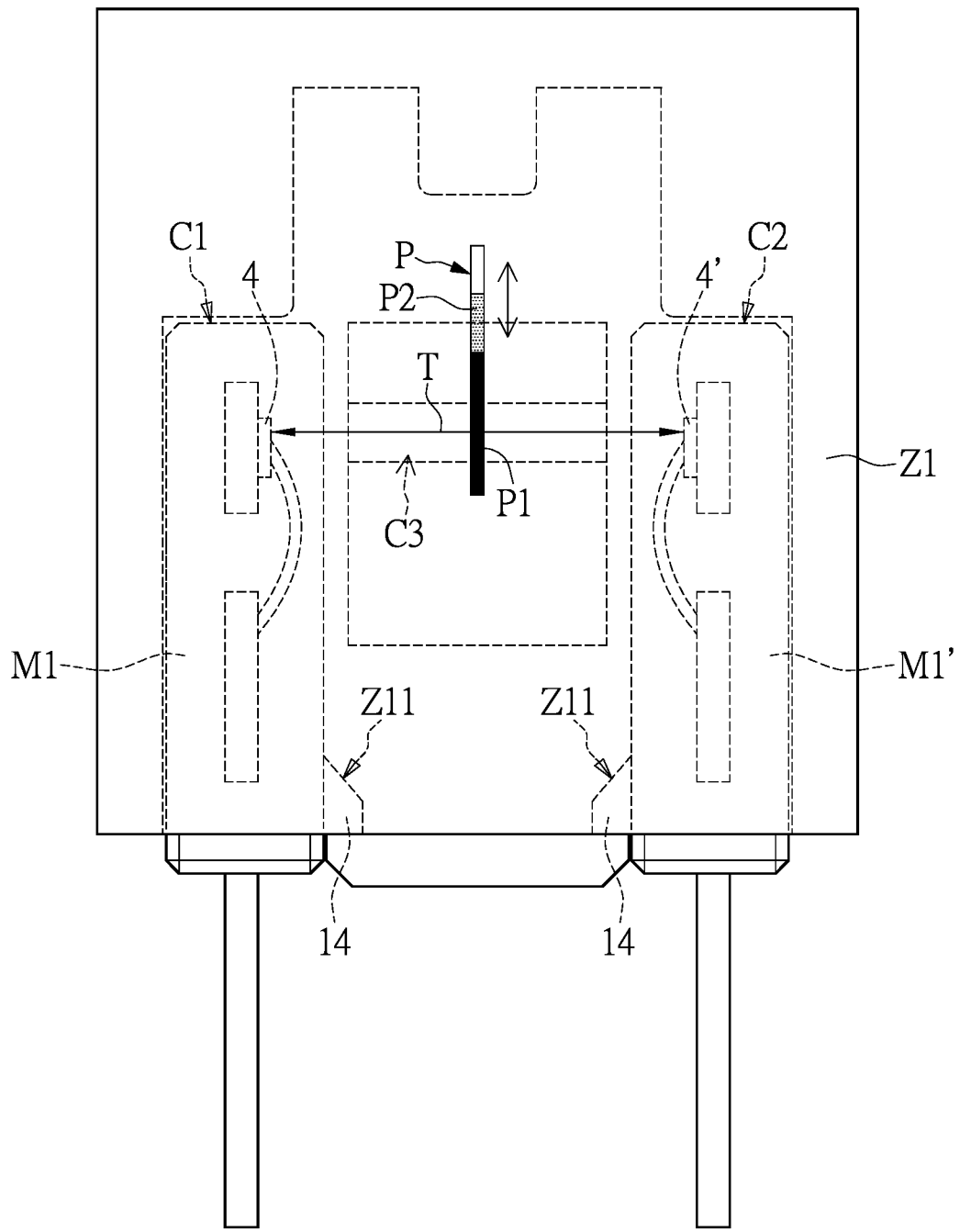
FIG. 10 is a schematic perspective view of a photo-interrupting device in a first position according to the present disclosure.
Figure 11:
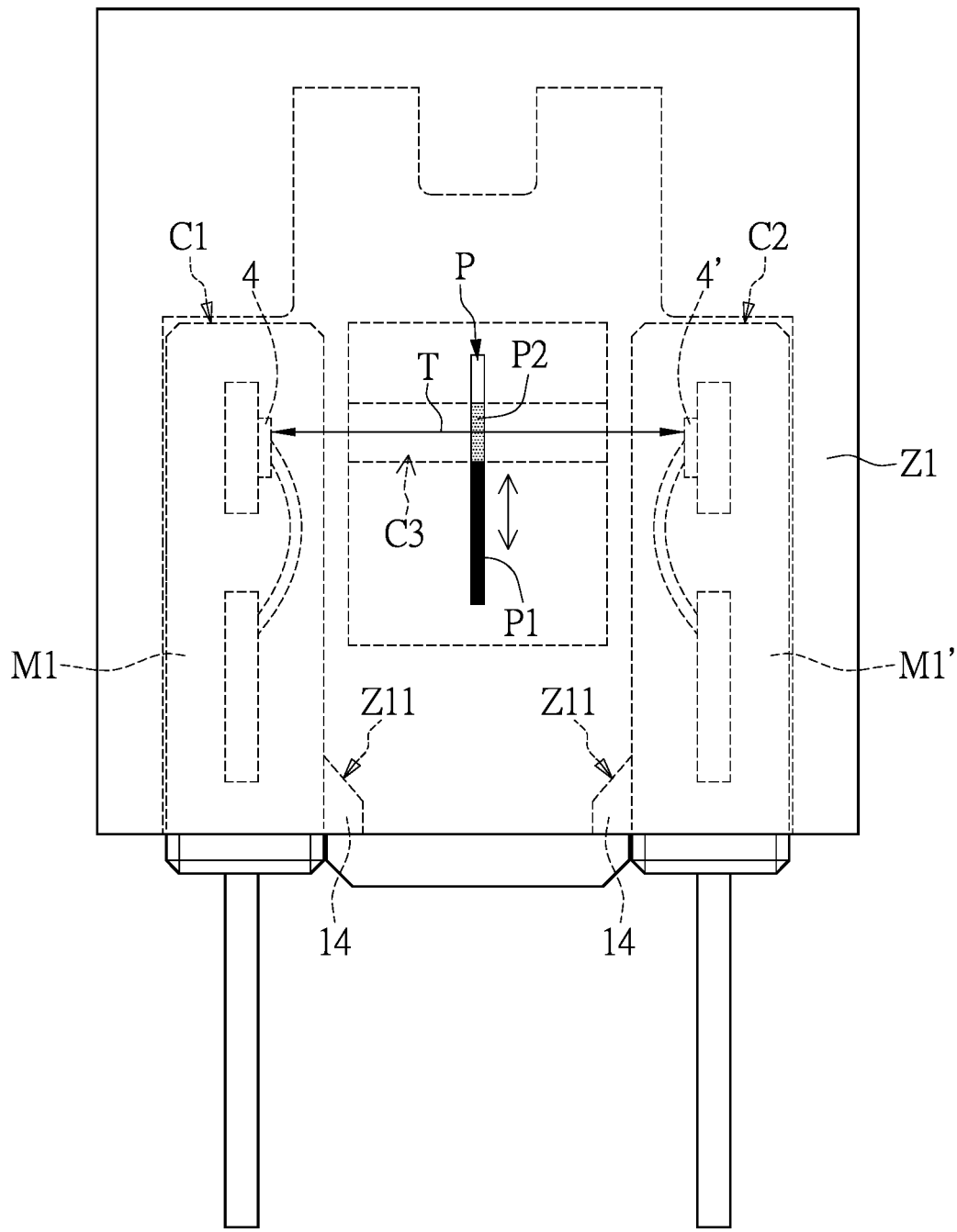
FIG. 11 is a schematic perspective view of the photo-interrupting device in a second position according to the present disclosure.

In addition, referring to FIG. 9, FIG. 9 is a schematic perspective view of the optoelectronic package structure without the sealing element according to another embodiment of the present disclosure. By a comparison of FIG. 9 and FIG. 6, the housing 1 of FIG. 9 not only encapsulates the one part of the first lead frame 2 and the one part of the second lead frame 3, but can also at least partially fill a gap N between the first lead frame 2 and the second lead frame 3. Specifically, the housing 1 of FIG. 9 also includes an engagement structure 15. The engagement structure 15 is formed by projecting from a bottom surface of the cavity 130 of the housing 1, further filling the gap N between the first lead frame 2 and the second lead frame 3, and extending to at least a part of an upper surface of the first bending portion 22 and at least a part of an upper surface of the mounting portion 23 of the first lead frame 2, and to at least a part of an upper surface of the second bending portion 32 and at least a part of an upper surface of the third bending portion 33 of the second lead frame 3. The optoelectronic element 4, the conducting wire A and a wire bonding region of the second lead frame 3 are exposed through the engagement structure 15. The engagement structure 15 can increase an area of the housing 1 coupling to the first lead frame 2 and the second lead frame 3, and strengthen the coupling force between the housing 1 and the first lead frame 2 as well as the second lead frame 3, so that unevenness or peeling is not easily produced between the housing 1 and the first lead frame 2 as well as the second lead frame 3. Referring to FIG. 1, FIG. 10, and FIG. 11, FIG. 10 and FIG. 11 are schematic perspective views of a photo-interrupting device when an object to be detected is in different positions according to the present disclosure. The present disclosure provides a photo-interrupting device Z (e.g., a light sensor), which includes a casing Z1 and two optoelectronic package structures M1, M1'. Structures of the two optoelectronic package structures M1, M1' are as described above, and will not be reiterated herein. The casing Z1 of the present disclosure has two accommodating compartments C1, C2 for respectively accommodating the two optoelectronic package structures M1, M1', and a plurality of walls that define the two accommodating compartments C1, C2. In addition, one of the plurality of walls that is arranged between the two accommodating compartments C1, C2 has a through hole C3 arranged thereon. The optoelectronic package structures M1, M1' respectively have optoelectronic elements 4, 4' disposed therein and spaced apart by a predetermined distance T, and the predetermined distance T is a length of the optical path of the photo-interrupting device Z. Notably, the through hole C3 is located between the two optoelectronic package structures M1, M1' and is corresponding to the optoelectronic elements 4, 4'. Moreover, the photo-interrupting device Z further includes an object to be detected P, and the object to be detected P can reciprocate the move (e.g., up and down) between the two optoelectronic package structures M1, M1'. Specifically, the two optoelectronic package structures M1, M1' are respectively disposed in the two accommodating compartments C1, C2 of the casing Z1. The optoelectronic element 4 (e.g., the light-emitting element) arranged in the optoelectronic package structure M1 is used for emitting light at a specific wavelength (e.g., when the optoelectronic element 4 is the IR LED, the light emitted is infrared); the optoelectronic element 4' (e.g., the light-receiving element) arranged in the optoelectronic package structure M1' is used for receiving the light emitted from the optoelectronic element 4.

When the photo-interrupting device Z is in operation, infrared light is emitted from the optoelectronic element 4 (e.g., the light-emitting element). The infrared light passes through the sealing element 5 to exit the optoelectronic package structure M1. Thereafter, when the infrared light passes through the through hole C3 on the wall between the two accommodating compartments C1, C2 toward the optoelectronic element 4' (e.g., the light-receiving element), the infrared light enters the optoelectronic package structure M1' to be received by the optoelectronic element 4' (e.g., the light-receiving element). In accordance with the amount of light received, the optoelectronic element 4' (e.g., the light-receiving element) generates an electromotive force to output a signal. Therefore, a position of the object to be detected P in the optical path can be adjusted by moving the object to be detected P up and down as shown by a bi-directional arrow in FIG. 10.

In the present embodiment, the object to be detected P has a masking region P1 and a light-transmitting region P2. When the object to be detected P is in a first position (i.e., a user does not press a switch so that the object to be detected P does not move down as shown in FIG. 10), the masking region P1 covers the through hole C3 on the wall between the two accommodating compartments C1, C2. At this time, in a state where the optoelectronic element 4 (i.e., the light-emitting element) is emitting the light, an amount of the light received by the optoelectronic element 4' (i.e., the light-receiving element) is reduced since the masking region P1 of the object to be detected P is located in the optical path and blocks the light, thereby reducing current output by the optoelectronic element 4'. Conversely, when the object to be detected P moves and is located in a second position (i.e., the user presses the switch so that the object to be detected P moves down as shown in FIG. 11), the light-transmitting region P2 corresponds to the through hole C3 on the wall between the two accommodating compartments C1, C2. At this time, in a state where the optoelectronic element 4 (i.e., the light-emitting element) is emitting the light, the amount of the light received by the optoelectronic element 4' (i.e., the light-receiving element) is increased since the masking region P1 of the object to be detected P is not located in the optical path and the light can be received by the optoelectronic element 4' through the light-transmitting region P2, thereby increasing the current output by the optoelectronic element 4'. Therefore, the presence or absence of the masking region P1 of the object to be detected P can be detected by measuring the current output by the optoelectronic element 4'.

Further, as shown in FIG. 1 and FIG. 10, the second end 12 of each of the two housings 1 of the two optoelectronic package structures M1, M1' has a concave part 121 formed in a center thereof, the first surface 13 of each of the two housings 1 of the two optoelectronic package structures M1, M1' has a bump 14 formed thereon, and the bump 14 is adjacent to the concave part 121 of the second end 12. In the present embodiment, the bump 14 can be a trapezoidal structure, but is not limited thereto. In this way, when the two optoelectronic package structures M1, M1' and the casing Z1 are assembled into the photo-interrupting device Z, each of the two optoelectronic package structures M1, M1' are fixed through the bump 14 of the housing 1 by snap engagement in a corresponding snap groove Z11 arranged in the casing Z1, so as to increase accuracy of optical positioning. In addition, the concave part 121 is mainly used to prevent problems such as surface unevenness or depression caused by shrinkage of the plastic due to a great difference in thickness between the bump 14 and other areas of the housing 1 when the plastic is injection molded into the housing 1.

Beneficial Effects of the Embodiments

In conclusion, one of the beneficial effects of present disclosure is that, in the optoelectronic package structure provided by the present disclosure, by virtue of "the optoelectronic element 4 disposed on the first lead frame, and the optoelectronic element 4 being electrically connected to the second lead frame 3 through the conducting wire A" and "the sealing element 5 covering the optoelectronic element 4 and sealing the opening 131, and the surface of the sealing element 5 being not higher than the first surface 13 of the housing 1," the size of the optoelectronic package structure M can be reduced.

Another one of the beneficial effects of present disclosure is that, compared to conventional photointerrupter which include a protruded lens protruding on each of the light-emitting element and the light-receiving element, the overall size and the required optical path of the photo-interrupting device Z provided by the present disclosure is reduced. Specifically, the optoelectronic package structure M provided by the present disclosure is the package structure with the PLCC, and the light emitting angle and the light extraction efficiency can be increased through the reflector cup (i.e., the cavity 130) of the housing 1. Therefore, the lens can be omitted, and the overall size of the optoelectronic package structure M can be significantly reduced. In addition, a length of the optical path between the two optoelectronic elements 4, 4' can be reduced as much as possible in the absence of the lens.

Furthermore, the optoelectronic element 4 (4') disposed in the optoelectronic package structure M1 (M1') provided by the present disclosure can be an emitter or a receiver That is to say, in the present disclosure, the optoelectronic package structure can be formed to include the emitter and the receiver by using a same mold, thereby effectively reducing manufacturing costs.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optoelectronic package structure, comprising:
a first lead frame;
a second lead frame spaced apart from the first lead frame;
an optoelectronic element disposed on the first lead frame, wherein the optoelectronic element is electrically connected to the second lead frame through a conducting wire;
a housing encapsulating one part of the first lead frame and one part of the second lead frame, the one part of the first lead frame arranged in the housing having a first extension portion, the one part of the second lead frame arranged in the housing having a second extension portion, a textured area including a plurality of substantially square protrusions is formed on each of a surface of the first extension portion and a surface of the second extension portion, wherein the housing includes a first surface, a second surface, a first end, and a second end, the first surface and the second surface are arranged opposite to each other, the first end and the second end are arranged opposite to each other, the first surface and the second surface are connected between the first end and the second end, the textured area on each of the first extension portion and the second extension portion has a first boundary line and a second boundary line, and the first boundary line is closer to the second end than the second boundary line, another part of the first lead frame and another part of the second lead frame both protrude from the second end and are parallel to each other, the housing has a cavity recessed inward from the first surface, the cavity is surrounded by an inner wall integrally formed with the housing, the cavity has an opening on the first surface, and the optoelectronic element is arranged in the cavity and exposed through the opening; and
a sealing element covering the optoelectronic element and sealing the opening, wherein a surface of the sealing element is not higher than the first surface.

2. The optoelectronic package structure according to claim 1, wherein the housing is made of a light-reflective material, the cavity and the inner wall surrounding the cavity collectively form a reflector cup, a portion of the first lead frame and a portion of the second lead frame are exposed from the reflector cup, and a projection of the reflector cup on the first surface is in a rectangular shape.

3. The optoelectronic package structure according to claim 1, wherein the one part of the first lead frame arranged in the housing further has a first bending portion and a mounting portion, the mounting portion is arranged adjacent to the first end, the first bending portion is connected between the first extension portion and the mounting portion, and the optoelectronic element is located on the mounting portion of the first lead frame.

4. The optoelectronic package structure according to claim 3, wherein the mounting portion has a plurality of flanges, and the plurality of flanges are evenly arranged at a periphery of the mounting portion.

5. The optoelectronic package structure according to claim 3, wherein the second lead frame is bent and extends toward the second end of the housing, the one part of the second lead frame arranged in the housing further has a second bending portion and a third bending portion, the second bending portion is connected between the second extension portion and the third bending portion, the second extension portion and the third bending portion extend toward the second end of the housing, and the optoelectronic element is electrically connected to the second bending portion through the conducting wire.

6. The optoelectronic package structure according to claim 5, wherein the second bending portion and the third bending portion are spaced apart from the mounting portion, the first bending portion, and the first extension portion.

7. The optoelectronic package structure according to claim 5, wherein each of the first extension portion and the second extension portion is adjacent to the second end.

8. The optoelectronic package structure according to claim 7, wherein a length of distribution of the textured area on the surface of the first extension portion is about 1.5 to 2.5 times of a width of the first lead frame, and a length of distribution of the textured area on the surface of the second extension portion is about 1.5 to 2.5 times of a width of the second lead frame.

9. The optoelectronic package structure according to claim 8, wherein there is a distance from the first boundary line to portions of the second end where the first lead frame and the second lead frame protrude outward, and the distance ranges between 0.1 mm and 0.45 mm.

10. The optoelectronic package structure according to claim 1, wherein the part of the first lead frame that is arranged in the housing includes a stepped structure, the part of the second lead frame that is arranged in the housing includes another stepped structure, and each of the stepped structures includes two protruding parts; wherein the two protruding parts of the stepped structure of the first lead frame are symmetrically formed on two side surfaces of the first lead frame; and wherein the two protruding parts of the stepped structure of the second lead frame are symmetrically formed on two side surfaces of the second lead frame.

11. The optoelectronic package structure according to claim 1, wherein the housing further includes a concave part and a bump that are contiguous, the concave part is formed in a center position of a surface of the second end, and the bump is formed on the first surface and extends in a direction away from the first surface.

12. The optoelectronic package structure according to claim 1, wherein a step structure is formed at a boundary between the inner wall and the first surface of the housing, the step structure has a third surface, the third surface is parallel to the first surface, the third surface and the first surface have a predetermined height therebetween, and the predetermined height from the third surface to the first surface ranges between 0.05 mm and 2 mm.

13. The optoelectronic package structure according to claim 1, wherein a surface of the first end of the housing has a slot.

14. The optoelectronic package structure according to claim 1, wherein the first lead frame and the second lead frame are spaced apart from a gap, the housing at least partially fills the gap between the first lead frame and the second lead frame, and correspondingly extends to a part of an upper surface of the first lead frame and a part of an upper surface of the second lead frame.

15. The optoelectronic package structure according to claim 1, wherein the optoelectronic package structure is a light-emitting element or a light-receiving element.

16. A photo-interrupting device, comprising:
a casing; and
two optoelectronic package structures as claimed in claim 1;
wherein the two optoelectronic package structures are disposed in the casing and opposite to each other, and the two optoelectronic package structures have an optical path with a predetermined distance;
wherein the optoelectronic element in one of the two optoelectronic package structures is configured to emit light at a specific wavelength, and the optoelectronic element in another one of the two optoelectronic package structures is configured to receive the light at the specific wavelength.

17. The photo-interrupting device according to claim 16, further comprising:
an object to be detected having a light-transmitting region and a masking region;
wherein the casing has two accommodating compartments arranged therein, the two optoelectronic package structures are respectively arranged in the two accommodating compartments, the object to be detected is configured to move reciprocally between the two optoelectronic package structures, so that the light-transmitting region or the masking region is located in the optical path accordingly to change an amount of light received by one of the two optoelectronic package structures.

18. An optoelectronic package structure, comprising:
a first lead frame;
a second lead frame spaced apart from the first lead frame;
an optoelectronic element disposed on the first lead frame, wherein the optoelectronic element is electrically connected to the second lead frame through a conducting wire;
a housing encapsulating one part of the first lead frame and one part of the second lead frame, wherein the housing includes a first surface, a second surface, a first end, and a second end, the first surface and the second surface are arranged opposite to each other, the first end and the second end are arranged opposite to each other, the first surface and the second surface are connected between the first end and the second end, another part of the first lead frame and another part of the second lead frame both protrude from the second end and are parallel to each other, the housing has a cavity recessed inward from the first surface, the cavity is surrounded by an inner wall integrally formed with the housing, the cavity has an opening on the first surface, and the optoelectronic element is arranged in the cavity and exposed through the opening; and
a sealing element covering the optoelectronic element and sealing the opening, wherein a surface of the sealing element is not higher than the first surface;
wherein the housing further includes a concave part and a bump that are contiguous, the concave part is formed in a center position of a surface of the second end, and the bump is formed on the first surface and extends in a direction away from the first surface.

19. An optoelectronic package structure, comprising:

a first lead frame;

a second lead frame spaced apart from the first lead frame;

an optoelectronic element disposed on the first lead frame, wherein the optoelectronic element is electrically connected to the second lead frame through a conducting wire;

a housing encapsulating one part of the first lead frame and one part of the second lead frame, wherein the housing includes a first surface, a second surface, a first end, and a second end, the first surface and the second surface are arranged opposite to each other, the first end and the second end are arranged opposite to each other, the first surface and the second surface are connected between the first end and the second end, another part of the first lead frame and another part of the second lead frame both protrude from the second end and are parallel to each other, the housing has a cavity recessed inward from the first surface, the cavity is surrounded by an inner wall integrally formed with the housing, the cavity has an opening on the first surface, and the optoelectronic element is arranged in the cavity and exposed through the opening; and a sealing element covering the optoelectronic element and sealing the opening, wherein a surface of the sealing element is not higher than the first surface;

wherein the part of the first lead frame that is arranged in the housing includes a stepped structure, the part of the second lead frame that is arranged in the housing includes another stepped structure, and each of the stepped structures includes two protruding parts.

* * * * *